US010763295B2

(12) United States Patent
Warashina et al.

(10) Patent No.: US 10,763,295 B2
(45) Date of Patent: Sep. 1, 2020

(54) IMAGING APPARATUS AND ELECTRONIC DEVICE

(71) Applicant: SONY CORPORATION, Tokyo (JP)

(72) Inventors: Takashi Warashina, Kumamoto (JP); Kazuyuki Takahashi, Kumamoto (JP); Mutsumi Kubota, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/306,112

(22) PCT Filed: Apr. 19, 2017

(86) PCT No.: PCT/JP2017/015653
§ 371 (c)(1),
(2) Date: Nov. 30, 2018

(87) PCT Pub. No.: WO2017/217109
PCT Pub. Date: Dec. 21, 2017

(65) Prior Publication Data
US 2019/0123090 A1 Apr. 25, 2019

(30) Foreign Application Priority Data
Jun. 15, 2016 (JP) .................. 2016-118961

(51) Int. Cl.
H04N 9/04 (2006.01)
H04N 5/3745 (2011.01)
(Continued)

(52) U.S. Cl.
CPC .. H01L 27/14645 (2013.01); H01L 27/14618 (2013.01); H01L 27/14621 (2013.01);
(Continued)

(58) Field of Classification Search
CPC ......... H01L 27/14645; H01L 27/14618; H01L 27/14625; H01L 27/14623;
(Continued)

(56) References Cited

U.S. PATENT DOCUMENTS 5,864,146 A * 1/1999 Karellas .................. A61B 6/06
250/581
6,448,562 B1 * 9/2002 Seidler ...................... G01T 3/00
250/358.1
(Continued)

FOREIGN PATENT DOCUMENTS

CN 101919256 A 12/2010
CN 102403326 A 4/2012
(Continued)

OTHER PUBLICATIONS

International Search Report and Written Opinion of PCT Application No. PCT/JP2017/015653, dated May 23, 2017, 9 pages of ISRWO.

Primary Examiner — Dramos Kalapodas
(74) Attorney, Agent, or Firm — Chip Law Group

(57) ABSTRACT

Achieving an imaging apparatus capable of performing both photographing of visible light and photographing of invisible light with a normal solid-state imaging element used for visible light photographing. An imaging apparatus including: a solid-state imaging element having a plurality of pixels two-dimensionally arrayed on an imaging surface; a light shielding unit that shields an invisible light imaging region of the solid-state imaging element in a space above the imaging surface of the solid-state imaging element; a first optical system that allows light corresponding to visible light contained in external light to be incident on the visible light imaging region of the solid-state imaging element; and a second optical system that allows light corresponding to
(Continued)

invisible light contained in external light to be incident on an invisible light imaging region covered by the light shielding unit.

10 Claims, 9 Drawing Sheets

(51) Int. Cl.
    *H01L 27/146*     (2006.01)
    *H04N 5/369*     (2011.01)
    *H04N 5/376*     (2011.01)
    *H04N 5/378*     (2011.01)

(52) U.S. Cl.
    CPC .. *H01L 27/14623* (2013.01); *H01L 27/14625* (2013.01); *H04N 5/3696* (2013.01); *H04N 5/378* (2013.01); *H04N 5/3765* (2013.01); *H04N 5/37455* (2013.01); *H04N 9/0455* (2018.08)

(58) Field of Classification Search
    CPC ............ H01L 27/14621; H04N 5/3696; H04N 5/378; H04N 5/3765; H04N 5/37455; H04N 9/0455; G01J 1/00; G01J 1/429; G01J 1/42; G01J 1/0492; G01J 1/4204; G01J 1/0271
    See application file for complete search history.

(56) References Cited

U.S. PATENT DOCUMENTS

| | | | | |
|---|---|---|---|---|
| 8,180,022 | B2 * | 5/2012 | Tseng | G01T 1/20 250/368 |
| 2002/0070365 | A1 * | 6/2002 | Karellas | A61B 6/06 250/581 |
| 2003/0169847 | A1 * | 9/2003 | Karellas | A61B 6/482 378/98.3 |
| 2006/0152610 | A1 | 7/2006 | Voronov et al. | |
| 2006/0202125 | A1 * | 9/2006 | Suhami | B82Y 20/00 250/368 |
| 2009/0050811 | A1 * | 2/2009 | Barrett | A61B 6/4258 250/363.04 |
| 2010/0100275 | A1 * | 4/2010 | Mian | B61L 1/20 701/31.4 |
| 2011/0024642 | A1 * | 2/2011 | Tredwell | H01L 27/14663 250/370.09 |
| 2011/0050941 | A1 | 3/2011 | Hiramoto et al. | |
| 2012/0057055 | A1 | 3/2012 | Yokogawa | |
| 2012/0092131 | A1 * | 4/2012 | Vasic | G02B 6/0045 340/10.1 |
| 2013/0223593 | A1 * | 8/2013 | Jouno | H01L 31/085 378/62 |
| 2015/0373243 | A1 | 12/2015 | Toda | |
| 2016/0142660 | A1 | 5/2016 | Shen et al. | |
| 2017/0012069 | A1 * | 1/2017 | Rudmann | H01L 27/14685 |
| 2018/0226443 | A1 * | 8/2018 | Yu | G03B 3/02 |

FOREIGN PATENT DOCUMENTS

| | | |
|---|---|---|
| CN | 105428376 A | 3/2016 |
| EP | 2428993 A2 | 3/2012 |
| JP | 06-129908 A | 5/1994 |
| JP | 08-68863 A | 3/1996 |
| JP | 2009-089158 A | 4/2009 |
| JP | 2012-059865 A | 3/2012 |
| JP | 5113249 B2 | 1/2013 |
| KR | 10-2011-0084367 A | 7/2011 |
| KR | 10-2012-0025973 A | 3/2012 |
| TW | 201031188 A | 8/2010 |
| TW | 201225270 A | 6/2012 |
| TW | 201436178 A | 9/2014 |
| TW | 201540066 A | 10/2015 |
| WO | 2006/076654 A2 | 7/2006 |
| WO | 2009/044544 A1 | 4/2009 |
| WO | 2010/058545 A1 | 5/2010 |
| WO | 2014/125945 A1 | 8/2014 |
| WO | 2015/130226 A1 | 9/2015 |

* cited by examiner

IMAGING APPARATUS AND ELECTRONIC DEVICE

CROSS REFERENCE TO RELATED APPLICATIONS

This application is a U.S. National Phase of International Patent Application No. PCT/JP2017/015653 filed on Apr. 19, 2017, which claims priority benefit of Japanese Patent Application No. JP 2016-118961 filed in the Japan Patent Office on Jun. 15, 2016. Each of the above-referenced applications is hereby incorporated herein by reference in its entirety.

TECHNICAL FIELD

The present technology relates to an imaging apparatus and an electronic device.

BACKGROUND ART

In recent years, solid-state imaging elements such as CMOS image sensors have been widespread, and they are used in place of film-type photographing devices in various fields. The solid-state imaging element is utilized in place of a film-type photographing device in the normal photographing using visible light, and beyond this, it is more utilized than ever in photographing using invisible light such as ultraviolet rays, infrared rays, X-rays, and gamma rays.

However, performing visible light photographing and invisible light photographing using the same single solid-state imaging element is not a typical method. Note that a technique for enabling two types of photographing to be performed on the same single solid-state imaging element is disclosed in Patent Document 1, for example. Patent Document 1 discloses a technique of dividing an imaging region of an imaging element, utilizing one of divided imaging regions for normal visible light photographing, and utilizing the other of the divided imaging regions for color spectrum photographing.

CITATION LIST

Patent Document

Patent Document 1: Japanese Patent Application Laid-Open No. 2012-59865

SUMMARY OF THE INVENTION

Problems to be Solved by the Invention

In the solid-state imaging element described in Patent Document 1, however, a plasmon resonator as a filter that transmits an electromagnetic wave of a desired wavelength is formed beforehand in a light shielding region layer of constituent pixels of an imaging region used for photographing a color spectrum. That is, the solid-state imaging element described in Patent Document 1 needs to have a structure different from that of a normal solid-state imaging element.

The present technology has been made in view of the above problems, and aims to provide an imaging apparatus capable of both visible light photographing and invisible light photographing while using a general solid-state imaging element used for visible light imaging.

Solutions to Problems

An aspect of the present technology is an imaging apparatus including: a solid-state imaging element having a plurality of pixels two-dimensionally arrayed on an imaging surface; a light shielding unit that shields an invisible light imaging region of the solid-state imaging element in a space above the imaging surface of the solid-state imaging element; a first optical system that allows light corresponding to visible light contained in external light to be incident on the visible light imaging region; and a second optical system that allows light corresponding to invisible light contained in external light to be incident on an invisible light imaging region covered by the light shielding unit.

Furthermore, another aspect of the present technology is an electronic device including: a solid-state imaging element having a plurality of pixels two-dimensionally arrayed on an imaging surface; a light shielding unit that shields an invisible light imaging region of the solid-state imaging element in a space above the imaging surface of the solid-state imaging element; a first optical system that allows light corresponding to visible light contained in external light to be incident on the visible light imaging region; a second optical system that allows light corresponding to invisible light contained in external light to be incident on an invisible light imaging region covered by the light shielding unit; and a display apparatus that displays information regarding the invisible light, based on a signal photoelectrically converted on a pixel of the invisible light imaging region.

Note that the imaging apparatus described above include various modes such as being implemented in a state of being incorporated in another device or being implemented together with other methods.

Effects of the Invention

According to the present technology, it is possible to realize an imaging apparatus capable of performing both photographing of both visible light and photographing of invisible light with a solid-state imaging element used for normal visible light photographing. Note that effects described in the present description are provided for purposes of exemplary illustration and are not intended to be limiting. Still other additional effects may also be contemplated.

MODE FOR CARRYING OUT THE INVENTION

Hereinafter, the present technology will be described in the following order.

(A) First embodiment:
(B) Second Embodiment:
(C) Third embodiment:
(D) Fourth Embodiment:
(E) Fifth embodiment:

(A) First Embodiment

Figure 1:
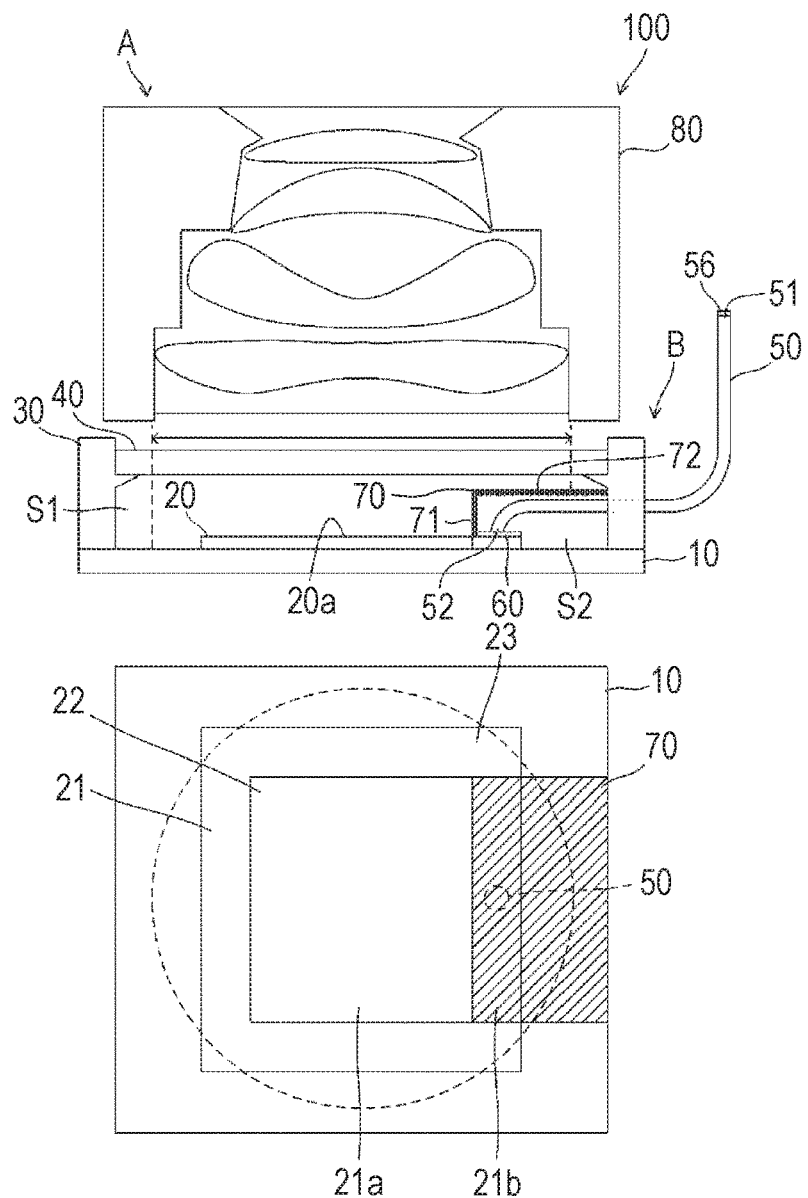
FIG. 1 is a diagram illustrating a schematic configuration of an imaging apparatus according to a first embodiment.

FIG. 1 is a diagram illustrating a schematic configuration of an imaging apparatus 100 according to the present embodiment.

The imaging apparatus 100 includes a substrate 10, a solid-state imaging element 20, a frame body 30, a transparent plate 40, an optical fiber 50, a scintillator 60, a light shielding unit 70, and a lens system 80.

The solid-state imaging element 20 is fixedly mounted on the substrate 10, and is electrically connected to a land on the substrate 10 via bonding wires, BGA, (not illustrated), or the like. The solid-state imaging element 20 has a configuration similar to a general solid-state imaging element used in visible light imaging and includes an imaging region 21 having a plurality of pixels arrayed in a two-dimensional matrix along an imaging surface 20a. The imaging region 21 includes an effective pixel region 22 having an array of pixels in which a photoelectric conversion unit is not shielded and an optical black pixel region 23 having an array of pixels in which the photoelectric conversion unit is shielded.

In the solid-state imaging element 20, a portion of the effective pixel region 22 is used as a first region 21a, while the other portion of the effective pixel region 22 is used as a second region 21b. The first region 21a is a region into which light is incident via a first optical system A and constitutes a visible light imaging region used for capturing visible light. That is, light incident in the first region 21a via the first optical system A includes visible light, not including invisible light to which the solid-state imaging element 20 has no photosensitivity, or including very weak invisible light alone that can be disregarded compared with the visible light. The second region 21b is a region into which light is incident via a second optical system B, and is an invisible light imaging region used for imaging invisible light. That is, the light incident in the second region 21b through the second optical system B includes invisible light in a specific wavelength range, not including visible light, or including very weak invisible light alone that can be disregarded compared with the invisible light having a specific wavelength range.

That is, the solid-state imaging element 20 is configured to be able to execute both imaging of visible light using the first optical system A and pixels of the first region 21a and photographing of invisible light that uses the second optical system B and pixels of the second region 21b. Hereinafter, while ultraviolet rays in a predetermined wavelength range will be described as an example of invisible light in a specific wavelength range imaged by using the second region 21b, invisible light in a specific wavelength range may be infrared rays, X-rays, γ-rays, or the like. Note that the external light indicates light incident from the outside of the first optical system A or the second optical system B.

The first optical system A includes a member that directs light according to a visible light component contained in the external light to be incident on the first region 21a of the solid-state imaging element 20. In the present embodiment, the first optical system A includes a frame body 30, a lens system 80, and a transparent plate 40.

The frame body 30 is formed on the substrate 10 so as to surround the solid-state imaging element 20, and is formed to have a greater height than the solid-state imaging element 20 in the shape of a thin plate. A transparent plate 40 is fixed to an upper portion of the frame body 30 so as to cover the upper side of the solid-state imaging element 20 while being separated from the upper surface of the solid-state imaging element 20. That is, the solid-state imaging element 20 is disposed in a closed space S1 closed by the substrate 10, the frame body 30, and the transparent plate 40.

The transparent plate 40 is constituted with a transparent glass plate or a transparent resin plate and is disposed so that the side surface facing the solid-state imaging element 20 is substantially parallel to the surface of the substrate 10. The closed space S1 between the transparent plate 40 and the solid-state imaging element 20 may be in a hollow state, or a solid state filled with a transparent resin or the like. The transparent plate 40 functions as an unwanted light cut filter that cuts unwanted light by providing a coating or the like that reflects unwanted light such as ultraviolet rays and infrared rays within a predetermined wavelength range.

The lens system 80 is disposed at a position closer to the light source, above the transparent plate 40. The lens system 80 collects and emits external light to the imaging surface 20a of the solid-state imaging element 20 through the transparent plate 40.

That is, external light from which ultraviolet rays as invisible light in a specific wavelength range have been cut by the unwanted light cut filter function of the transparent plate 40 is emitted onto the imaging surface 20a of the solid-state imaging element 20.

The second optical system B is constituted by a member that direct light according to invisible light (ultraviolet rays in the present embodiment) in a specific wavelength range included in external light to be incident on the second region 21b of the solid-state imaging element 20. In the present embodiment, the second optical system B includes the light shielding unit 70, the optical fiber 50, and the scintillator 60.

The light shielding unit 70 is a member that shields the second region 21b in the space above the solid-state imaging element 20 from light incident on the imaging region 21 via the first optical system A. The light shielding unit 70 covers the entire second region 21b to shield the light. FIG. 1 illustrates a partition wall 71 extending upward from the imaging surface 20a of the solid-state imaging element 20 to partition the first region 21a from the second region 21b, and a partition wall 72 extending from the upper end of the partition wall 71 toward the second region 21b side in a direction substantially parallel to the imaging surface 20a to shield light incident on the imaging region 21 via the first optical system A. Note that he light shielding unit 70 may have a structure as necessary in which the partition walls 71 and 72 and the inner side surface of the frame body 30 is connected so as to cover the second region 21b by the light shielding unit 70 coupled to the frame body 30. Note that the substrate 10 and the frame body 30 together with the light shielding unit 70 are opaque.

In this manner, the second region 21b is positioned in a light shielding space S2 integrally closed by the light shielding unit 70, the substrate 10, and a portion of the frame body 30 as necessary. Therefore, the light incident on the first region 21a via the above-described first optical system A, that is, the light including visible light would not become incident on the second region 21b.

In contrast, an optical fiber 50 constituting the second optical system B directs light corresponding to external light to be incident into the light shielding space S2 formed on the second region 21b. The photoelectric conversion unit of the pixel in the second region 21b receives light corresponding to external light incident on the second optical system B and generates a charge corresponding to the amount of received light.

As the optical fiber 50, it is allowable to use a hollow core optical fiber capable of transmitting invisible light in a specific wavelength range.

The optical fiber 50 is configured to arrange the entrance opening 51 outside the closed space S1 and the exit opening 52 in the light shielding space S2 and configured to penetrate the side wall of the closed space S1 and the side wall of the light shielding space S2. In the example illustrated in FIG. 1, the S1 optical fiber 50 is provided to penetrate the side wall of the closed space S1 and the frame body 30 constituting the side wall of the light shielding space S2.

The optical fiber 50 includes a wavelength selection filter 56 that prevents incidence of light (electromagnetic wave) in a specific wavelength range from the entrance opening 51. The wavelength selection filter 56 functions as a bandpass filter of a wavelength to be sensed via the second region 21b of the solid-state imaging element 20, or as a cut filter of visible light as unwanted light. In other words, the optical fiber 50 selectively transmits the invisible light in a specific wavelength range included in the external light incident on the entrance opening 51, and emits the light from the exit opening 52.

Note that a plasmon filter that transmits invisible light in a specific wavelength range may be provided as the wavelength selection filter 56. The plasmon filter is constituted by a structure performing plasmon resonance. The structure performing plasmon resonance is, for example, a subwavelength structure obtained by microfabricating a thin film including a conductive material (specifically, silver, aluminum, gold or the like is preferable) having a plasma frequency in the ultraviolet wavelength range. The basic structure of the plasmon resonator is a hole array structure, in which holes (through holes or non-through holes) having a diameter smaller than the detection wavelength are arranged in a two-dimensional array and the dielectric material is filled in the holes. Furthermore, while it is preferable to arrange the holes in a honeycomb or orthogonal matrix, it is possible to apply other arrangements as long as they are periodical structures.

Figure 2:
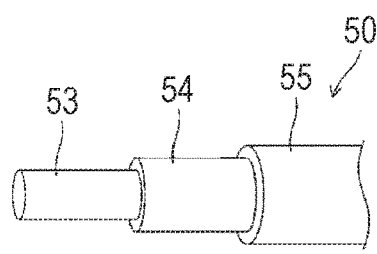
FIG. 2 is a diagram illustrating a cross-sectional structure of an optical fiber.

FIG. 2 is a diagram illustrating a cross-sectional structure of the optical fiber 50. As illustrated in the figure, the optical fiber 50 has a cylindrical shape and has a structure in which a core portion 53, a clad portion 54, and a cover portion 55 are sequentially and substantially concentrically disposed from the center of the cylinder toward the peripheral portion. The cover portion 55 is a non-light transmitting member that does not transmit visible light or ultraviolet rays as invisible light in a specific wavelength range. With a configuration to cover the periphery of the light guide structure including the core portion 53 and the clad portion 54 with the cover portion 55 of the opaque member, it is possible to prevent the stray light incident from a portion other than the entrance opening 51 from being transmitted through the optical fiber 50.

Note that it also allowable to use, as the optical fiber 50, a specific light source optical fiber having a high transmittance in a specific wavelength range or a hollow core optical fiber capable of transmitting invisible light in a specific wavelength range without damage.

The optical fiber 50 has a V number (normalized frequency) represented by the following Formula (1) is less than 2.405. In the following Formula (1), $\lambda$ is a wavelength of light to be detected, a is a diameter of the core portion 53, NA is a numerical aperture of the optical fiber 50, $n_1$ is a refractive index of the core portion 53, and $n_2$ is a refractive index of the clad portion 54.

[Mathematical Expression 1]

$$\begin{aligned} V &= \frac{2\pi}{\lambda} \times a \times NA \\ &= \frac{2\pi}{\lambda} \times a \times \sqrt{n_1^2 - n_2^2} \end{aligned} \qquad (1)$$

The scintillator 60 is disposed in the vicinity of an imaging surface of the second region 21b within the closed space S1. The scintillator 60 is disposed between the exit opening 52 of the optical fiber 50 and the second region 21b of the imaging surface of the solid-state imaging element 20. For example, the scintillator 60 is laid just above an imaging surface of the second region 21b, and the optical fiber 50 is disposed so that light emitted from the exit opening 52 is incident substantially perpendicularly to the imaging surface of the solid-state imaging element 20. With this arrangement, scintillation light (visible light) excited in the scintillator 60 by the ultraviolet rays emitted from the exit opening 52 of the optical fiber 50 is incident on the second region 21b.

The configuration for performing conversion into an electric signal incident in the imaging region 21 on the above-described solid-state imaging element 20 is similar to that of the conventional solid-state imaging element, and an example thereof will be described below.

Figure 3:
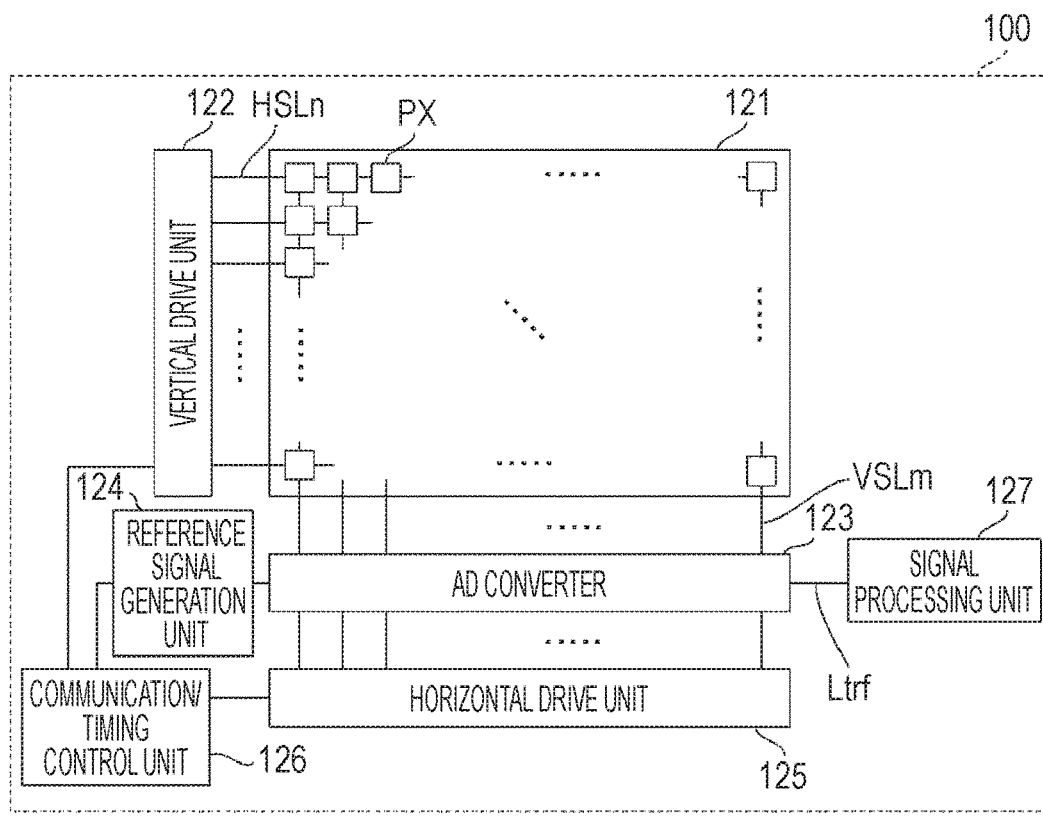
FIG. 3 is a block diagram illustrating an exemplary configuration of an imaging apparatus according to the first embodiment.

FIG. 3 is a block diagram illustrating an exemplary configuration of the imaging apparatus 100. In the present embodiment, a CMOS image sensor which is one type of X-Y address type solid-state imaging element will be described as an example of the imaging apparatus. Hereinafter, a specific example of the imaging apparatus as a CMOS image sensor will be described with reference to FIG. 3.

In FIG. 3, the imaging apparatus 100 includes a pixel portion 121, a vertical drive unit 122, an analog/digital converter 123 (AD converter 123), a reference signal generation unit 124, a horizontal drive unit 125, a communication/timing control unit 126, and a signal processing unit 127.

The pixel portion 121 includes a two-dimensional array of a plurality of pixels PX including a photodiode as a photoelectric conversion unit. The light receiving surface side of the pixel portion 121 includes a color filter array in which the colors of filters are differentiated corresponding to individual pixels. Note that a specific circuit configuration of the pixel PX will be described later.

The pixel portion 121 has wiring of n pixel drive lines HSLn (n=1, 2, . . . ) and m vertical signal lines VSLm (m=1, 2, . . . ). The pixel drive line HSLn is wired so that the length direction is along the right and left direction in the drawing (pixel arrangement direction of the pixel row/horizontal direction) so as to be arranged at equal intervals in the vertical direction in the drawing. The vertical signal line VSLm is wired so that the length direction is along the vertical direction in the drawing (pixel arrangement direction of the pixel column/the vertical direction) so as to be arranged at equal intervals in the horizontal direction of the drawing.

One end of the pixel drive line HSLn is connected to an output terminal corresponding to each of rows of the vertical drive unit 122. The vertical signal line VSLm is connected to the pixel PX in each of the columns, and one end thereof is connected to the AD converter 123. The vertical drive unit 122 and the horizontal drive unit 125 perform control of sequentially reading analog signals from the individual pixels PX constituting the pixel portion 121 under the control of the communication/timing control unit 126. Note that specific connections of the pixel drive line HSLn and the vertical signal line VSLm to each of the pixels PX will be described later together with the description of the pixel PX.

The communication/timing control unit 126 includes, for example, a timing generator and a communication interface. The timing generator generates various clock signals on the basis of a clock (master clock) input from the outside. The communication interface receives data, or the like, instructing an operation mode given from the outside of the imaging apparatus 100, and outputs data including internal information of the imaging apparatus 100 to the outside.

On the basis of the master clock, the communication/timing control unit 126 generates a clock having the same frequency as that of the master clock, a clock obtained by dividing the clock by two, a low-speed clock obtained by more frequency division, or the like, and supplies generated clocks to individual components (the vertical drive unit 122, the horizontal drive unit 125, the AD converter 123, the reference signal generation unit 124, and the signal processing unit 127, or the like).

The vertical drive unit 122 is constituted with, for example, a shift register, an address decoder, or the like. The vertical drive unit 122 includes a vertical address setting unit for controlling a row address and a row scanning control unit for controlling row scanning on the basis of a signal obtained by decoding a video signal input from the outside.

The vertical drive unit 122 is capable of a read-out scan and a sweep-out scan.

Read-out scanning is a scan that sequentially selects unit pixels from which signals are read out. Basically, the read-out scan is performed in order of rows, but in the case of thinning pixels by adding or averaging the outputs of a plurality of pixels in a predetermined positional relationship, they are performed in a predetermined order.

Sweep-out scanning is scanning operation for resetting a unit pixel belonging to a row or a pixel combination as a read-out target ahead of the read-out scan by a time corresponding to a shutter speed for the row or the pixel combination as the read-out target in the read-out scan.

The horizontal drive unit 125 sequentially selects each of ADC circuits constituting the AD converter 123 in synchronization with the clock output from the communication/timing control unit 126. The AD converter 123 includes ADC circuits (m=1, 2, . . . ) provided for each of the vertical signal lines VSLm, converts analog signals output from the individual vertical signal lines VSLm into digital signals, and outputs the signal to the horizontal signal line Ltrf under the control of the horizontal drive unit 125.

The horizontal drive unit 125 includes, a horizontal address setting unit and a horizontal scanning unit, for example, and selects individual ADC circuits of the AD converter 123 corresponding to read-out columns in the horizontal direction defined by the horizontal address setting unit, so as to lead the digital signal generated in the selected ADC circuit to the horizontal signal line Ltrf.

The digital signal output from the AD converter 123 in this manner is input to the signal processing unit 127 via the horizontal signal line Ltrf. The signal processing unit 127 performs processing of converting a signal output from the pixel portion 121 via the AD converter 123 into an image signal corresponding to the color arrangement of a color filter array by arithmetic processing.

Furthermore, the signal processing unit 127 performs processing of thinning the pixel signals in the horizontal direction and the vertical direction by adding, averaging, or the like, as necessary. The image signal generated in this manner is output to the outside of the imaging apparatus 100.

The reference signal generation unit 124 includes a digital-analog converter (DAC), and generates a reference signal Vramp in synchronization with the count clock supplied from the communication/timing control unit 126. The reference signal Vramp is a saw-tooth wave (ramp waveform) that changes in a stepwise manner from an initial value supplied from the communication/timing control unit 126.

This reference signal Vramp is supplied to each of the ADC circuits of the AD converter 123.

The AD converter 123 includes a plurality of the ADC circuits. In the AD conversion of the analog voltage output from each of pixels PX, the ADC circuit uses a comparator to compare voltage of the reference signal Vramp with the voltage of the vertical signal line VSLm during a predetermined AD conversion period and uses a counter to count any of times before or after reversal of the voltage relationship of the voltage of reference signal Vramp and the voltage (pixel voltage) of the vertical signal line VSLm. This makes it possible to generate a digital signal corresponding to the analog pixel voltage. Note that a specific example of the AD converter 123 will be described later.

Figure 4:
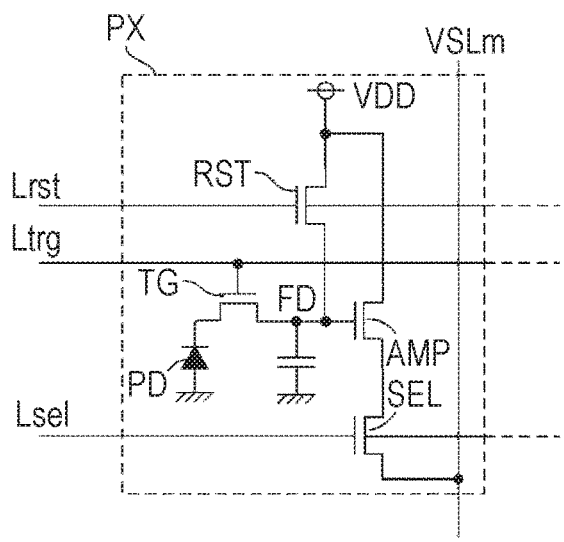
FIG. 4 is a diagram illustrating a circuit configuration of a pixel.

FIG. 4 is a diagram illustrating a circuit configuration of the pixel PX.

This figure illustrates an equivalent circuit of a pixel of a typical 4-transistor configuration. The pixel PX illustrated in the figure includes a photodiode PD and four transistors (a transfer transistor TG, a reset transistor RST, an amplification transistor AMP, and a selection transistor SEL).

The photodiode PD generates a current according to the amount of light received by photoelectric conversion.

The anode of the photodiode PD is connected to the ground, and its cathode is connected to the drain of the transfer transistor TG.

Various control signals are input to the pixel PX from the reset signal generation circuit of the vertical drive unit 122 and various drivers via the signal lines Ltrg, Lrst, or Lsel.

A signal line Ltrg for transmitting a transfer gate signal is connected to the gate of the transfer transistor TG. The source of the transfer transistor TG is connected to a connection point between the source of the reset transistor RST and the gate of the amplification transistor AMP. This connection point constitutes a floating diffusion FD which is a capacitance accumulating signal charges.

The transfer transistor TG turns on when a transfer signal is input to the gate through the signal line Ltrg and transfers the signal charge accumulated by the photoelectric conversion of the photodiode PD (here, photoelectron) to the floating diffusion FD.

A signal line Lrst for transmitting a reset signal is connected to the gate of the reset transistor RST, while a constant voltage source VDD is connected to the drain. The reset transistor RST turns on when a reset signal is input to the gate through the signal line Lrst and resets the floating diffusion FD to the voltage of the constant voltage source VDD. In contrast, in a case where the reset signal is not input to the gate through the signal line Lrst, the reset transistor RST is turned off, and a predetermined potential barrier is formed between the floating diffusion FD and the constant voltage source VDD.

The amplification transistor AMP has a gate connected to the floating diffusion FD, a drain connected to the constant voltage source VDD, and a source connected to the drain of the selection transistor SEL.

In the selection transistor SEL, the signal line Lsel of the selected signal is connected to the gate, and the source is connected to the vertical signal line VSLm. The selection transistor SEL turns on when a control signal (address signal or select signal) is input to the gate through the signal line Lsel and turns off in a case where this control signal is not input to the gate through the signal line Lsel.

When the selection transistor SEL is turned on, the amplification transistor AMP amplifies the voltage of the floating diffusion FD and outputs the amplified voltage to the vertical signal line VSLm. The voltage output from each of pixels PX through the vertical signal line VSLm is input to the AD converter 123.

Note that as the circuit configuration of the pixel PX, it is also possible to adopt various well-known configurations such as a three-transistor system configuration or another four-transistor system configuration, other than the configuration illustrated in FIG. 4. For example, an example of a configuration of another four-transistor system includes a configuration in which the selection transistor SEL is disposed between the amplification transistor AMP and the constant voltage source VDD.

Figure 5:
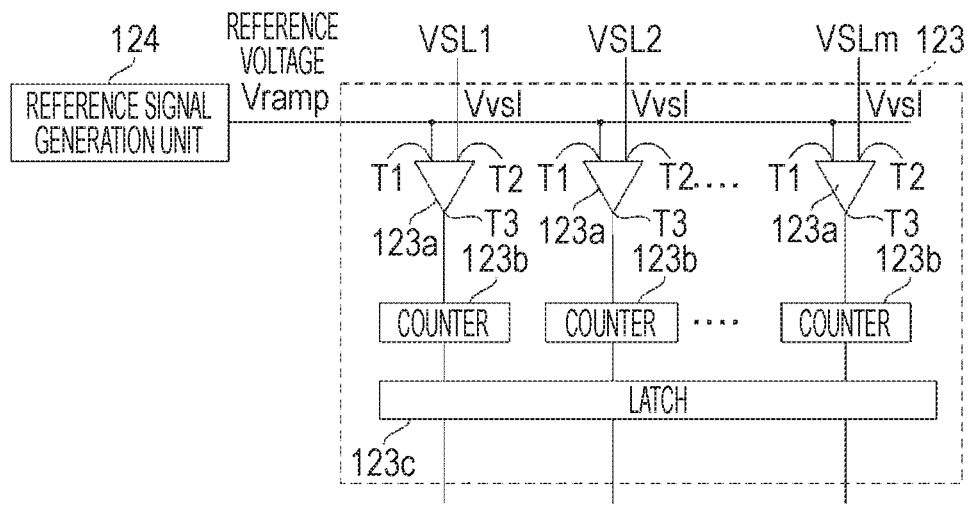
FIG. 5 is a diagram illustrating a configuration of an AD converter.

FIG. 5 is a diagram illustrating a configuration of the AD converter 123. As illustrated in the figure, each of the ADC circuits constituting the AD converter 123 includes a comparator 123a and a counter 123b provided for each of vertical signal line VSLm, and a latch 123c.

The comparator 123a has two input terminals T1 and T2, and one output terminal T3. One input terminal T1 receives an input of a reference signal Vramp from the reference signal generation unit 124 and the other input terminal T2 receives an input of an analog pixel signal (hereinafter referred to as pixel signal Vvsl) output from the pixel PX via the vertical signal line VSLm).

The comparator 123a compares the reference signal Vramp and the pixel signal Vvsl. The comparator 123a outputs a high level or low level signal in accordance with the magnitude relation between the reference signal Vramp and the pixel signal Vvsl. When the magnitude relation between the reference signal Vramp and the pixel signal Vvsl is switched, the output of the output terminal T3 is inverted between the high level and the low level.

The counter 123b receives a clock supplied from the communication/timing control unit 126, and uses this clock to count the time from the start to the end of the AD conversion. The timing of the start and end of the AD conversion is specified on the basis of the control signal (for example, the presence or absence of the input of the clock signal CLK, or the like) output from the communication/timing control unit 126 and on the basis of output inversion of the comparator 123a.

Furthermore, the counter 123b performs AD conversion on the pixel signal by correlated double sampling (CDS). Specifically, under the control of the communication/timing control unit 126, the counter 123b performs down-counting while an analog signal corresponding to a reset component is output from the vertical signal line VSLm. Then, the count value obtained by the down-counting is set as an initial value, and up-counting is performed while the analog signal corresponding to the pixel signal is output from the vertical signal line VSLm.

The count value generated in this manner is a digital value corresponding to the difference between the signal component and the reset component. In other words, the count value is a value obtained by calibrating, by using the reset component, a digital value corresponding to the analog pixel signal input from the pixel PX to the AD converter 123 through the vertical signal line VSLm.

The digital value generated by the counter 123b is stored in the latch 123c and sequentially output from the latch 123c under the control of the horizontal scanning unit and then output to the signal processing unit 127 via the horizontal signal line Ltrf.

Figure 6:
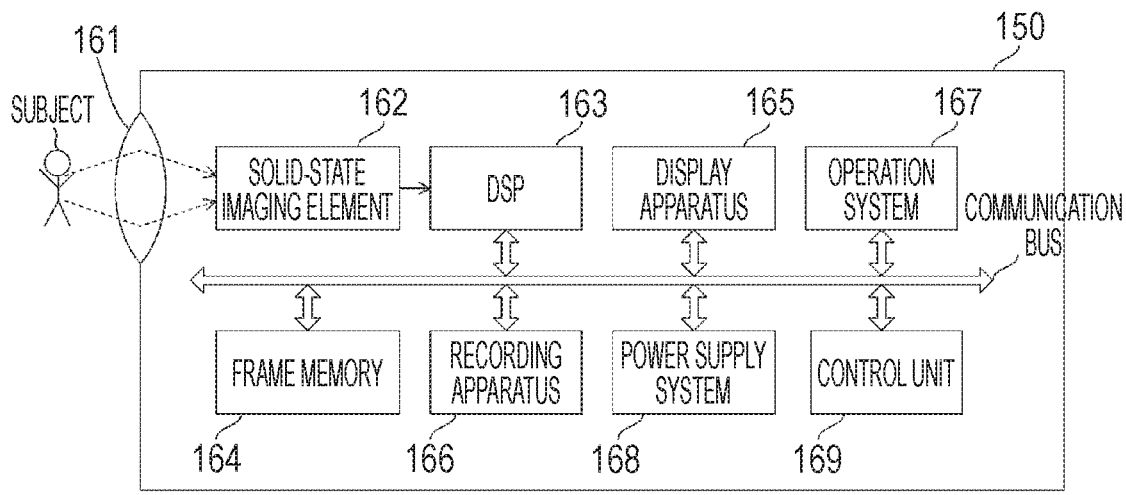
FIG. 6 is a diagram illustrating an example of an electronic device including the imaging apparatus according to the first embodiment

FIG. 6 is a diagram illustrating an example of an electronic device 150 including the imaging apparatus 100 described above.

Note that the electronic device 150 represents a general electronic device using a solid-state imaging element as an image capturing unit (photoelectric conversion unit), such as an imaging apparatus including a digital still camera or a digital video camera, a mobile terminal device such as a mobile phone having an imaging function, for example. Obviously, an electronic device using a solid-state imaging element in the image capturing unit also includes a copying machine using a solid-state imaging element in the image reading unit. Furthermore, the imaging apparatus may be a module including a solid-state imaging element so as to be mounted on the above-described electronic device.

In FIG. 6, the electronic device 150 includes an optical system 161 including a lens group, a solid-state imaging element 162, a digital signal processor (DSP) 163 as a signal processing circuit for processing output signals of the solid-state imaging element 162, a frame memory 164, a display apparatus 165, a recording apparatus 166, an operation system 167, a power supply system 168, and a control unit 169. Note that the solid-state imaging element 162 corresponds to the solid-state imaging element 20, and the optical system 161 corresponds to the first optical system A and the second optical system B.

The DSP 163, the frame memory 164, the display apparatus 165, the recording apparatus 166, the operation system 167, the power supply system 168, and the control unit 169 are mutually connected so as to be able to exchange data and signals with each other via a communication bus.

The optical system 161 captures incident light (image light) from a subject and forms an image on an imaging surface of the solid-state imaging element 162. The solid-state imaging element 162 generates an electric signal corresponding to the amount of received incident light formed on the imaging surface by the optical system 161 in units of pixels, and outputs the generated electric signal as a pixel signal. This pixel signal is input to the DSP 163 to undergo various image processing appropriately, and thereafter stored in the frame memory 164, recorded on a recording medium of the recording apparatus 166, or output to the display apparatus 165.

The display apparatus 165 is a panel type display apparatus such as a liquid crystal display apparatus or an organic electro luminescence (EL) display apparatus, and displays moving images and still images captured by the solid-state imaging element 162, and other information. The recording apparatus 166 records the moving image and the still image captured by the solid-state imaging element 162 on a recording medium such as a digital versatile disk (DVD), a hard disk (HD), or a semiconductor memory.

The operation system 167 receives various operations from the user, and transmits an operation command corresponding to the operation of the user to each of the units 163, 164, 165, 166, 168, and 169 via the communication bus. The power supply system 168 generates various power supply voltages as drive power supply and supplies the voltages appropriately to the supply targets (the respective sections 162, 163, 164, 165, 166, 167, and 169).

The control unit 169 includes a CPU that performs arithmetic processing, a ROM that stores a control program of the electronic device 150, a RAM that functions as a work area of the CPU, and the like. The control unit 169 causes the CPU to execute a control program stored in the ROM while using the RAM as a work area so as to control each of the units 163, 164, 165, 166, 167, and 168 via the communication bus Furthermore, the control unit 169 controls a timing generator (not illustrated) to generate various timing signals and performs control to supply the timing signals to each of units.

Figure 7:
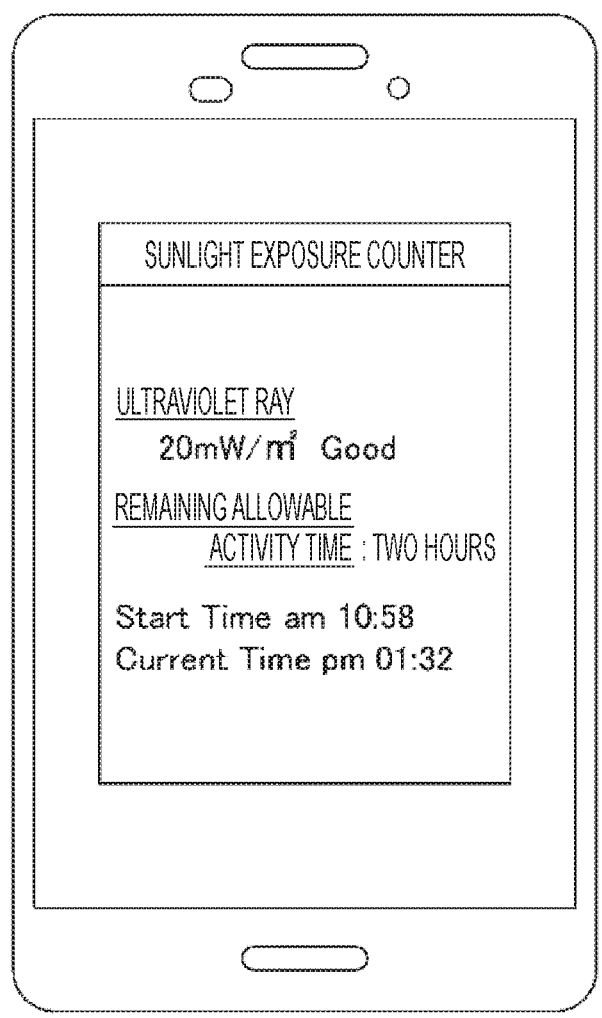
FIG. 7 is a diagram illustrating an example of items displayed on a display interface of an electronic device including the imaging apparatus according to the first embodiment.

The electronic device 150 described above enables display as illustrated in FIG. 7, for example.

The figure illustrates an example of items displayed on a display interface of a mobile communication device as the electronic device 150. The display interface displays a variety of information based on the amount of received ultraviolet rays, for example, intensity of ultraviolet rays as invisible light in a specific wavelength range, a standard indicating safety based on the intensity of the ultraviolet rays (Good/Normal/Caution, etc.), and remaining allowable activity time under the ultraviolet rays (or time to be exposed to the ultraviolet rays), for example. With this configuration, the user of the electronic device 150 can obtain information regarding the ultraviolet rays contained in the external light, based on an actual measurement result of the electronic device 150.

(B) Second Embodiment

Figure 8:
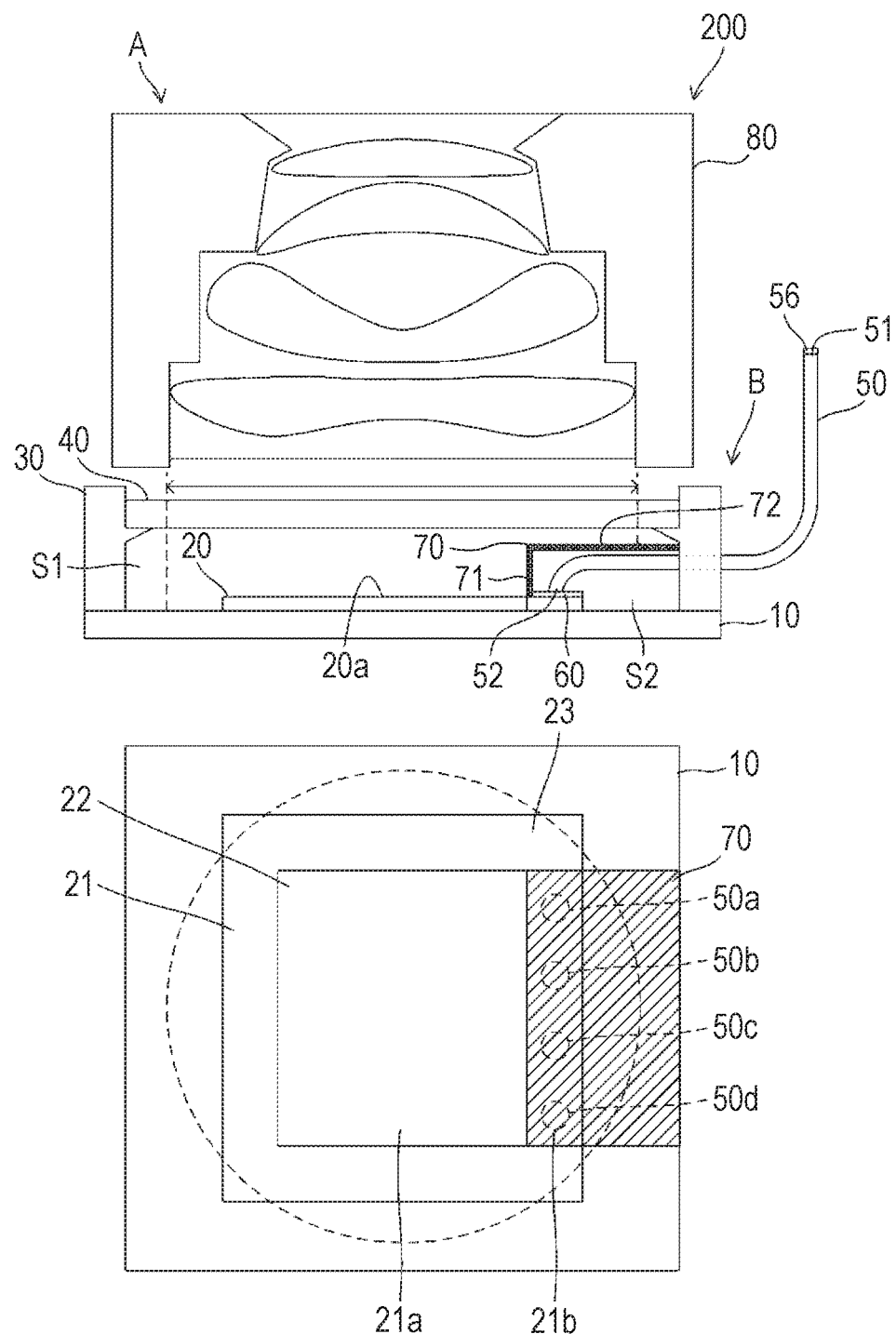
FIG. 8 is a diagram illustrating a schematic configuration of an imaging apparatus according to a second embodiment.

FIG. 8 is a diagram illustrating a schematic configuration of an imaging apparatus 200 according to the present embodiment.

The imaging apparatus 200 differs from the imaging apparatus 100 described above in that it has a plurality of optical fibers to transmit ultraviolet rays as invisible light in a specific wavelength range to the second region 21b. Still, the other configurations are common to the imaging apparatus 100 and therefore, a detailed description of the configuration other than the optical fiber will be omitted, and the same reference numerals as the imaging apparatus 100 will be used in the description.

As illustrated in FIG. 8, the imaging apparatus 200 includes a plurality of optical fibers 50a to 50d.

Each of the optical fibers 50a to 50d allows light corresponding to external light to be incident into the light shielding space S2 formed on the second region 21b, specifically, light corresponding to external light to be incident in mutually different regions (pixels) within the second region 21b.

The optical fibers 50a to 50d can transmit ultraviolet rays of mutually different types (frequencies) with V numbers (normalized frequencies) represented by the above Formula (1) being mutually different within a range of 2.405 or less. Note that it is also allowable to use, as the optical fibers 50a to 50d, hollow core optical fibers having mutually different frequencies of ultraviolet rays to be transmitted.

Figure 9:
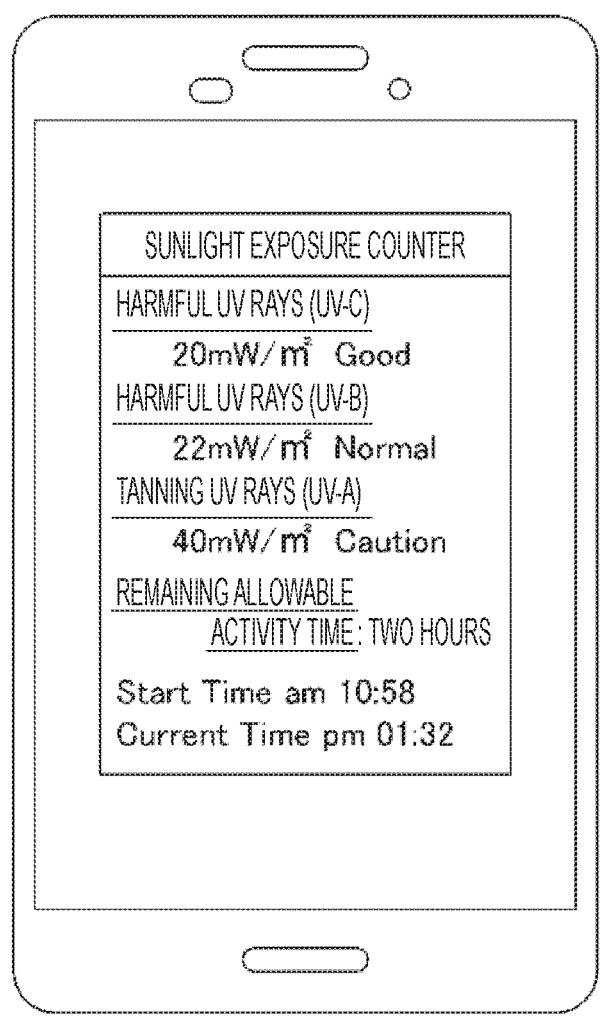
FIG. 9 is a diagram illustrating an example of items displayed on a display interface of an electronic device including the imaging apparatus according to the second embodiment.

In a case where the above-described electronic device 150 includes the imaging apparatus 200, for example, display as illustrated in FIG. 9 is possible. The figure illustrates an example of items displayed on a display interface of a mobile communication device as the electronic device 150. The display interface displays a variety of information based on the amount of received ultraviolet rays, for example, intensity of ultraviolet rays for each of types of ultraviolet rays (UV-C, UV-B, UV-A, etc.), an index of safety based on the intensity of each of types of ultraviolet rays (Good/Normal/Caution, etc.), and remaining allowable activity time under these ultraviolet rays (or time to be exposed to the ultraviolet rays), for example. With this configuration, the user of the electronic device 150 can obtain information regarding the ultraviolet rays contained in the external light, based on an actual measurement result of the electronic device 150, for each of the wavelength ranges of the ultraviolet rays.

(C) Third Embodiment

Figure 10:
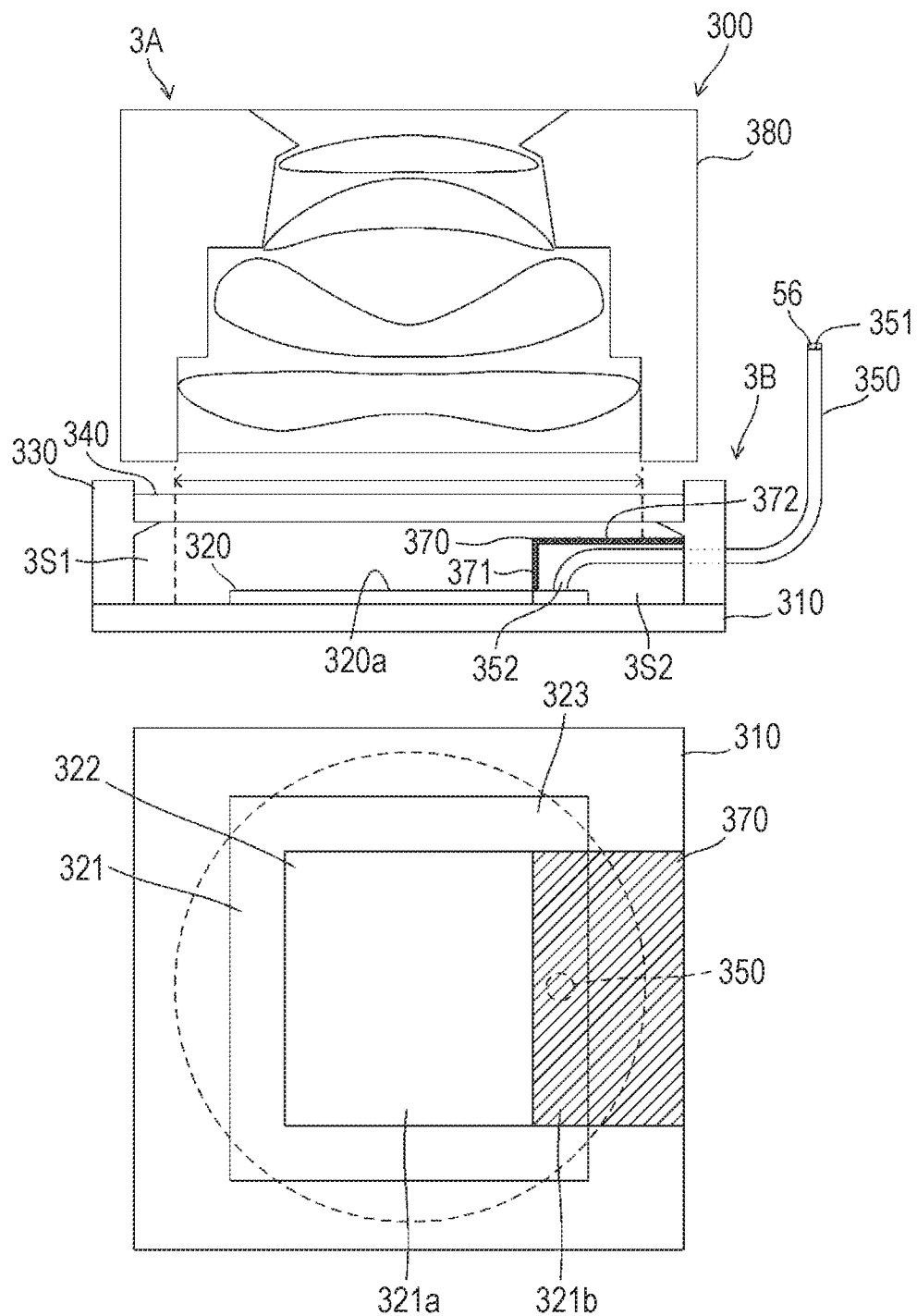
FIG. 10 is a diagram illustrating a schematic configuration of an imaging apparatus according to a third embodiment.

FIG. 10 is a diagram illustrating a schematic configuration of an imaging apparatus 300 according to the present embodiment.

The imaging apparatus 300 includes a substrate 310, a solid-state imaging element 320, a frame body 330, a transparent plate 340, a scintillation fiber 350, a light shielding unit 370, and a lens system 380.

Note that the imaging apparatus 300 according to the present embodiment has a similar configuration to the imaging apparatus 100 according to the first embodiment, except that the scintillation fiber 350 is included in place of the optical fiber 50 and the scintillator 60. Therefore, in the following description, similar configuration to that of the imaging apparatus 100 (the substrate 310, the solid-state imaging element 320, the frame body 330, the transparent plate 340, the light shielding unit 370, the lens system 380, or the like) will be described with corresponding reference numerals (with "3" added to the heads of the signs in the configuration of the imaging apparatus 100) and detailed description thereof will be omitted.

A first optical system 3A includes a member that guides external light to be incident into a first region 321a of the solid-state imaging element 320, specifically includes the frame body 330, the lens system 380, and the transparent plate 340, in the present embodiment.

The second optical system 3B includes a member that guides external light to be incident into a second region 321b of the solid-state imaging element 320, specifically includes the light shielding unit 370 and the scintillation fiber 350, in the present embodiment.

Specifically, however, the scintillation fiber 350 constituting the second optical system 3B allows light corresponding to external light different from the external light incident on the first optical system 3A, to be incident into a light shielding space 3S2 formed above the second region 321b. The photoelectric conversion unit of the pixel in the second region 321b receives light corresponding to external light incident on the second optical system 3B and generates a charge corresponding to the received light amount.

The scintillation fiber 350 is configured to arrange an entrance opening 351 outside a closed space 3S1 and an exit opening 352 in the light shielding space 3S2 and configured to penetrate the side wall of the closed space 3S1 and the side wall of the light shielding space 3S2. In the example illustrated in FIG. 10, the scintillation fiber 350 is provided to penetrate through the closed space 3S1 and the frame body 330 constituting the side wall of the light shielding space 3S2.

The entrance opening 351 of the scintillation fiber 350 includes a wavelength selection filter 356 that prevents incidence of light (electromagnetic wave) in a specific wavelength range from the entrance opening 351. The wavelength selection filter 356 functions as a bandpass filter of a wavelength to be sensed via the second region 321b of the solid-state imaging element 320, or as a cut filter of visible light as unwanted light.

A plasmon filter that transmits invisible light in a specific wavelength range may be provided as the wavelength selection filter 356. That is, the scintillation fiber 350 allows invisible light in a specific wavelength range included in external light incident on the entrance opening 351 to be selectively incident, and allows the scintillation light corresponding to the invisible light in the specific wavelength range to be emitted from the exit opening 52. With this configuration, invisible light of a specific wavelength range of external light (ultraviolet rays in the present embodiment) is selectively incident on the scintillation fiber 350. Accordingly, the scintillation fiber 350 transmits scintillation light generated in accordance with the amount of ultraviolet rays contained in the external light incident on the entrance opening 351 so as to exit the light from the exit opening 352. The intensity of the scintillation light sensed in this manner can be sensed as the intensity of ultraviolet rays and a variety of information based on the amount of received ultraviolet rays can be displayed, similarly to the first embodiment and the second embodiment.

(D) Fourth Embodiment

Figure 11:
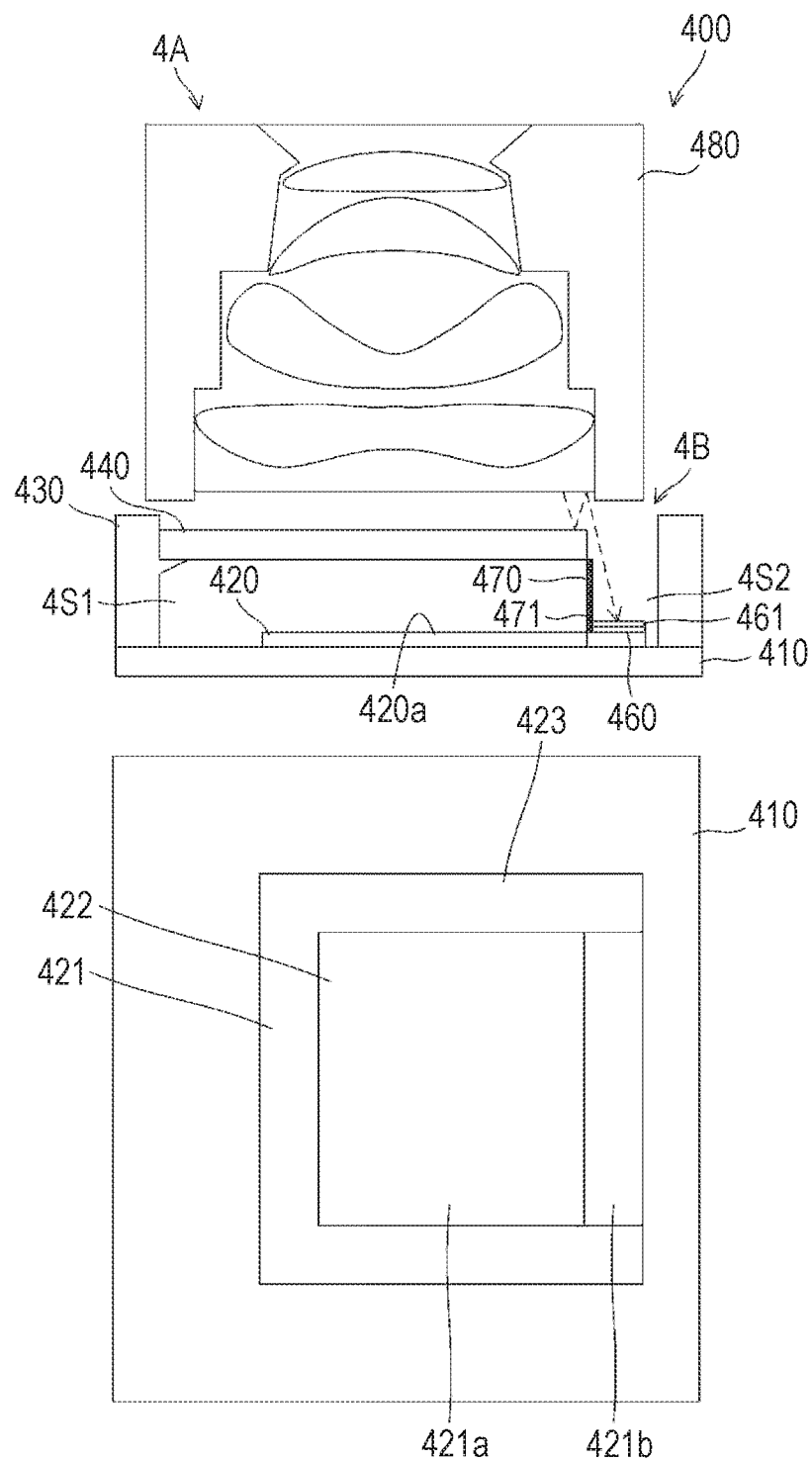
FIG. 11 is a diagram illustrating a schematic configuration of an imaging apparatus according to a fourth embodiment.

FIG. 11 is a diagram illustrating a schematic configuration of an imaging apparatus 400 according to the present embodiment.

The imaging apparatus 400 includes a substrate 410, a solid-state imaging element 420, a frame body 430, a transparent plate 440, a scintillator 460, a light shielding unit 470, and a lens system 480.

Note that the imaging apparatus 400 according to the present embodiment has a configuration similar to the imaging apparatus 100 according to the first embodiment except that the optical fiber 50 is not provided and the structures of the transparent plate 440 and the light shielding unit 470 are different from the imaging apparatus 100. Therefore, in the following description, the configuration similar to that of the imaging apparatus 100 (the substrate 410, the solid-state imaging element 420, the frame body 430, the lens system 480, or the like) will be described with corresponding reference numerals (with "4" added to the heads of the signs of the configuration of the imaging apparatus 100) and detailed description thereof will be omitted.

In the present embodiment, a first optical system 4A includes members so that light corresponding to a visible light component included in external light incident through the lens system 480 can be incident on a first region 421a of the solid-state imaging element 420, specifically includes the frame body 430, the lens system 480, and the transparent plate 440, in the present embodiment.

Another one, that is, a second optical system 4B includes a member that guides the invisible light component (ultraviolet component in the present embodiment) of a specific wavelength range of external light incident through the lens system 480 to the second region 421b of the solid-state imaging element 420, specifically, includes the transparent plate 440, the light shielding unit 470, and the scintillator 460, in the present embodiment.

While the transparent plate 440 is similar to the case of the first embodiment in that it is fixed to the upper part of the frame body 430 so as to cover the upper side of the solid-state imaging element 420, it is different from the case of the first embodiment in the structure that does not cover the upper part of the second region 421b although it covers the first region 421a of the solid-state imaging element 420.

The light shielding unit 470 is the similar to the case of the first embodiment in that it partitions the first region 421a from the second region 421b in a space between the solid-state imaging element 420 and the transparent plate 440. In the present embodiment, however, the light shielding unit 470 is formed as a partition wall 471 that reaches from the upper surface of the solid-state imaging element 420 to the lower surface of the transparent plate 440. Note that the light shielding unit 470 may also have a shape to connect the partition wall 471 to the inner surface of the frame body 430 as necessary.

In this manner, in the present embodiment, the second region 421b is configured as the imaging region 421 of the solid-state imaging element 420, disposed at the bottom of a surrounding space 4S2 in which light shielding unit 470 and the substrate 410 and a portion of the frame body 430 as necessary are integrated.

The upper opening of a surrounding space 4S1 is connected to the space between the upper surface of the transparent plate 440 and the lens system 480 and is configure so that he light having passed through the transparent plate 440 would not enter the surrounding space 4S2 whereas the light reflected on the upper surface of the transparent plate 440 is capable of entering the surrounding space 4S2. Furthermore, the upper opening of the surrounding space 4S2 is provided so as to be located outside an image circle of the light that passes through the lens system 480 to be emitted to the solid-state imaging element 420. Accordingly, light that passes through the lens system 480 does not directly enter the second region 421b.

The transparent plate 440 is disposed so that the side surface facing the solid-state imaging element 420 is substantially parallel to the surface of the substrate 410. The closed space 4S1 between the transparent plate 440 and the solid-state imaging element 420 may be in a hollow state or solid state filled with a transparent resin or the like. The transparent plate 440 functions as an unwanted light cut filter that cuts unwanted light by providing a coating or the like that reflects unwanted light such as ultraviolet rays and infrared rays within a predetermined wavelength range.

The lens system 480 is disposed at a position closer to the light source, above the transparent plate 440. The lens system 480 collects and emits external light to the imaging surface 420a of the solid-state imaging element 420 through the transparent plate 440. That is, external light from which ultraviolet rays have been cut by the unwanted light cut filter function of the transparent plate 440 is emitted onto the imaging surface 420a of the solid-state imaging element 420. Note that the surrounding space 4S2 is closed so as to suppress incidence of the external light other than the light passing through the lens system 480 to be incident on the imaging apparatus 400.

The ultraviolet rays reflected on the surface of the transparent plate 440 are incident into the surrounding space 4S1 due to reflection or the like and are incident above the scintillator 460 disposed on the second region 421b. Above the scintillator 460, a wavelength selection filter 461 for preventing incidence of light (electromagnetic wave) in a specific wavelength range is provided. The wavelength selection filter 461 functions as a bandpass filter of a wavelength to be sensed via the second region 421b of the solid-state imaging element 420, or as a cut filter of visible light as unwanted light. A plasmon filter that transmits invisible light in a specific wavelength range may be provided as the wavelength selection filter 356. In other words, the scintillator 460 selectively receives incidence of invisible light in a specific wavelength range included in incident light. The scintillator 460 generates scintillation light in an amount corresponding to the incident ultraviolet rays, and the generated scintillation light is received by the pixels constituting the second region 421b. In this manner, the intensity of the scintillation light sensed by the second region 421b is sensed as the intensity of the ultraviolet rays, and a variety of information based on the amount of received ultraviolet rays can be displayed similarly to the first embodiment and the second embodiment described above.

(E) Fifth Embodiment

Figure 12:
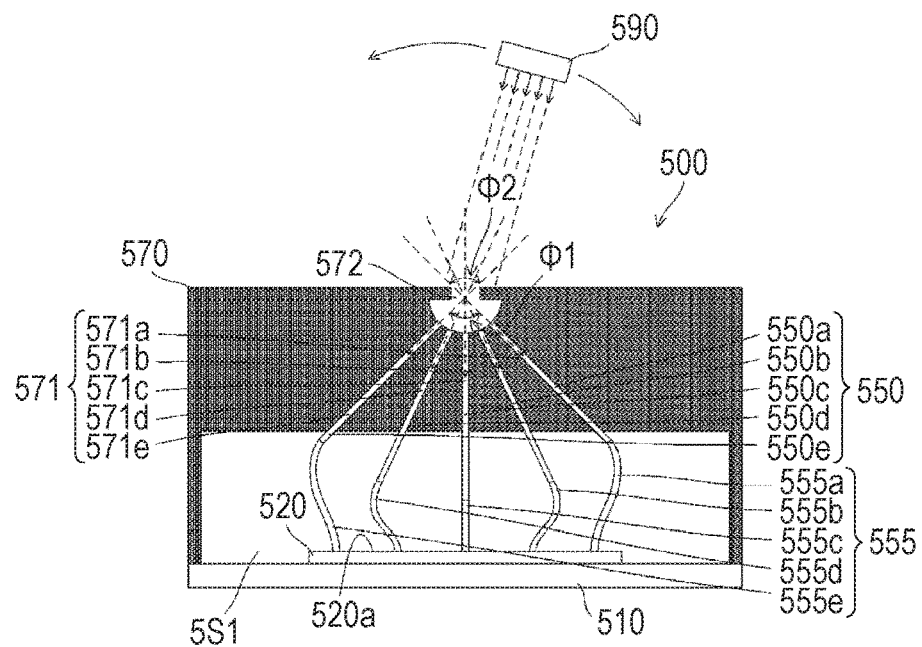
FIG. 12 is a diagram illustrating a schematic configuration of an imaging apparatus according to a fifth embodiment.

FIG. 12 is a diagram illustrating a schematic configuration of an imaging apparatus 500 according to the present embodiment.

The imaging apparatus 500 includes a substrate 510, a solid-state imaging element 520, a light shielding unit 570 having a pinhole, a scintillation fiber 550, and an optical fiber 555.

The solid-state imaging element 520 is fixedly mounted on the substrate 510, and is electrically connected to a land on the substrate 510 via wire bonding or BGA (not illustrated) or the like. Similarly to the solid-state imaging element 20 according to the first embodiment, the solid-state imaging element 520 includes an imaging region constituted by an effective pixel region and an optical black pixel region.

The light shielding unit 570 is formed by using a material that shields invisible light, for example, lead or tungsten in a case where the invisible light is X-rays or γ rays. The light shielding unit 570 is formed so as to cover the entire solid-state imaging element 520 on the substrate 510 excluding a through hole 571 through which a scintillation fiber is inserted, and is configured to shield the solid-state imaging element 520 from invisible light from the outside.

Hereinafter, a space substantially closed by the light shielding unit 570 above the substrate 510 will be referred to as a shielding space 5S1.

The light shielding unit 570 includes a pinhole-shaped concave portion 572 on the outer surface, and a plurality of through holes 571a to 571e linearly penetrating from the inside of the hole of the concave portion 572 to the shielding space 5S1 are radially formed from the center of the concave portion 572. Note that the through holes 571 illustrated in FIG. 12 are conceptually illustrated, and its quantity, length, density, etc. can be appropriately adjusted.

A pinhole diameter D1 of the concave portion 572 is set by the following Formula (2), for example, set to φ=0.08 mm in a case where f=5 mm. The light incident on the concave portion 572 can be incident into the shielding space 5S1 through the through holes 571a to 571e in the case where the light travels along any of extending directions of the through holes 571a to 571e. However, the light traveling along the direction different from any of the extending direction of the through holes 571a to 571e is shielded by the light shielding unit 570 and cannot be incident into the shielding space 5S1.

[Mathematical Expression 2]

$$D1 = \frac{\sqrt{f}}{28} \quad (2)$$

Linear scintillation fibers 550a to 550e are inserted through the through holes 571a to 571e, respectively. Invisible light incident through the pinhole-shaped concave portion 572 enters an end portion of the scintillation fibers 550a to 550e on the concave portion 572 side. Subsequently, invisible light rays substantially in agreement with the extending direction of the scintillation fibers 550a to 550e alone are guided through the scintillation fibers 550a to 550e along the extending direction of the scintillation fibers 550a to 550e (extending direction of the through holes).

The scintillation fibers 550a to 550e generates fluorescence when invisible light strikes a fluorescent substance in the scintillation fibers 550a to 550e while being guided through the fibers. Each of the scintillation fibers 550a to 550e has a length to achieve collision probability (probability that invisible light generates scintillation) between invisible light passing through the fiber and the fluorescent substance, of a certain value or more (for example, 70% or more).

For example, in order to achieve the collision probability of 70% or more between hard X-ray of 50 keV as invisible light and fluorescent substance in a case where a scintillation fiber of model number BCF-20 of Saint-Gobain K.K. is used, each of scintillation fibers 550a to 550e shall be 5 cm or more in length.

Furthermore, for example, in order to achieve the collision probability of 70% or more between hard X-ray or γ ray of 100 keV as invisible light and fluorescent substance in a case where a scintillation fiber of model number BCF-20 of Saint-Gobain K.K. is used, each of scintillation fibers 550a to 550e shall be 7.5 cm or more in length.

Furthermore, for example, in order to achieve the collision probability of 70% or more between the γ ray of 200 keV as invisible light and fluorescent substance in a case where a scintillation fiber of model number BCF-20 of Saint-Gobain K.K. is used, each of scintillation fibers 550a to 550e shall be 10 cm or more in length.

Optical fibers 555a to 555e are connected to the end portions of the scintillation fibers 550a to 550e on the shielding space 5S1 side, respectively. The optical fibers 555a to 555e have a cross-sectional structure similar to that of the optical fiber 50 in the above-described first embodiment.

The optical fibers 555a to 555e extend to connect between the scintillation fibers 550a to 550e and portions in the vicinity of the surface of the solid-state imaging element 520, and guide the light emitted from the scintillation fibers 550a to 550e to the surface of the solid-state imaging element 520.

The optical fibers 555a to 555e extend at mutually different positions in the imaging region 521 while maintaining mutual positional relationship in the scintillation fibers 550*a* to 550*e* in a direction along the imaging surface 520*a*. The light guided by each of the optical fibers 555*a* to 555*e* is incident on each of mutually different pixels (different imaging regions).

As a result, external light is incident on the solid-state imaging element 520 in a positional relationship in which the vertical and horizontal positions are inverted with the concave portion 572 as a center of symmetry, that is, obtained incident light is the incident light corresponding to each of points of an image that is a reduced and vertically and horizontally inverted version of the invisible light incident from the subject. The image formed in accordance with the light incident on the solid-state imaging element 520 in this manner is an image indicating the intensity distribution of the invisible light incident from the subject. In a case where the invisible light is X-ray, the obtained image is similar to X-ray photograph; in a case where the invisible light is γ ray, an obtained image is similar to a gamma camera image.

Additionally, it is also allowable to provide an invisible light source 590 that emits X-rays or γ-rays, as invisible light. In this case, for example, a subject such as a human body is arranged between the invisible light source 590 and the concave portion 572, and invisible light emitted from the invisible light source 590 passes through the subject and is incident on the concave portion 572. Among the light transmitted through the subject, the light that travels in the direction that agrees with the extending direction of any of the scintillation fibers generates scintillation light within the scintillation fiber while the light passes along the scintillation fibers 550*a* to 550*e*.

The invisible light source 590 is configured to be movable to change its position in various manners by a drive device (not illustrated), and to enable scanning at each of positions where the invisible light transmitted through the subject is to be incident onto the scintillation fibers 550*a* to 550*e*. The image created by the imaging apparatus 500 in accordance with the amount of light received by the solid-state imaging element 520 during this scanning period is to be a transmission image of X-rays or γ-rays of the subject. The scanning range of the invisible light source 590 includes a range of a vertical angle φ2 of a solid angle φ1 at which the scintillation fibers 550*a* to 550*e* are provided, with the concave portion 572 as a center of symmetry.

Figure 13:
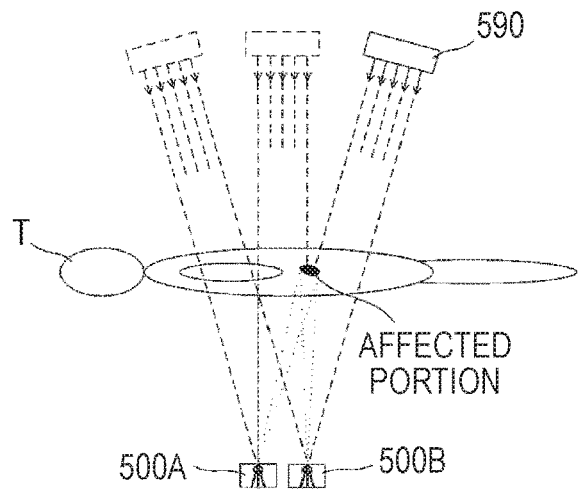
FIG. 13 is a diagram illustrating a use mode using two imaging apparatuses.

Furthermore, the two imaging apparatuses 500 can be used to measure the depth of the affected portion in the body of a patient as a subject. Hereinafter, two imaging apparatuses will be denoted by 500A and 500B. FIG. 13 is a diagram illustrating a use mode using two imaging apparatuses 500.

In this case, the imaging apparatus 500A and the imaging apparatus 500B are arranged side by side while being separated by a fixed length, and invisible light emitted from the same single invisible light source 590 and transmitted through the subject is captured by both of the imaging apparatuses 500A and 500B.

The scanning range of the invisible light source 590 is set within a range including both a range of a vertical angle φ2A of a solid angle φ1A of the scintillation fiber provided in the imaging apparatus 500A with a concave portion 572A of the imaging apparatus 500A as a center and a range of the vertical angle φ2B of a solid angle φ1B of the scintillation fiber provided in the imaging apparatus 500B with a concave portion 572B of the imaging apparatus 500B as a center.

Figure 14:
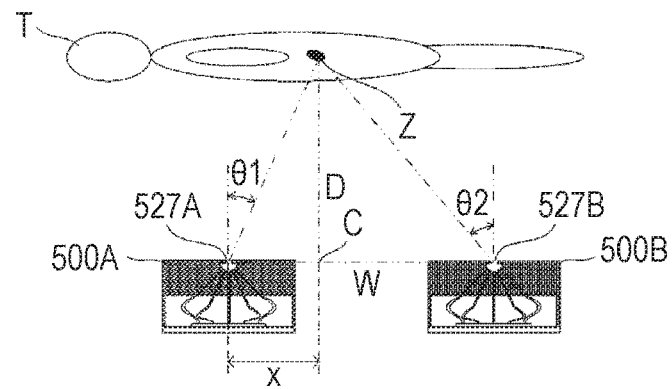
FIG. 14 is a diagram illustrating a method of calculating a distance D.

At this time, a distance D2 between the straight line connecting the concave portioned portion 527A of the imaging apparatus 500A with the concave portioned portion 527B of the imaging apparatus 500B and an affected portion Z can be expressed by the following Formula (3). FIG. 14 is a diagram illustrating a method of calculating the distance D2. Note that a line perpendicular to the straight line connecting the concave portion 527A and the concave portion 527B will be referred to as a normal in the following.

[Mathematical Expression 3]

$$D2 = \frac{W}{\tan\theta1 + \tan\theta2} \quad (3)$$

$$\begin{pmatrix} D2 \times \tan\theta1 = x \\ D2 \times \tan\theta2 = W - x \end{pmatrix}$$

In Formula (3), W is a distance between the concave portion 527A of the imaging apparatus 500A and the concave portion 572B of the imaging apparatus 500B, θ1 is an angle between the scintillation fiber through which light that has entered the pixel of the imaging apparatus 500A that photographed the affected portion Z whose depth is wanted, and the normal (angle of the invisible light that passed through the affected portion Z and then reached the concave portion 572A), and θ2 is an angle between the scintillation fiber through which light that has entered the pixel of the imaging apparatus 500B that photographed the affected portion Z whose depth is wanted, and the normal (angle of the invisible light that passed through the affected portion Z and then reached the concave portion 572). Furthermore, x represents a distance between an intersection C with the normal passing through the affected portion Z and the concave portion 527A on a straight line connecting the concave portioned part 527A and the concave portioned part 527B.

As illustrated in Formula (3), the distance D2 can be expressed without using the distance x.

Additionally, the distance W is known in Formula (3) and the angles θ1 and θ2 are values determined from the photographed image, and thus, the depth of the affected portion Z can be obtained from Formula (3). As described above, according to the imaging apparatus 500 of the present embodiment, it is possible to capture an image similar to an X-ray photograph or a gamma camera image. Furthermore, it is also possible to measure the depth of the affected portion Z by imaging by the imaging apparatus 500 arranged side by side.

Note that the present technology is not limited to each of the above-described embodiments and includes configurations including mutual replacement or various modifications of combinations of individual formations disclosed in the above embodiments, configurations including mutual replacement or various modifications of combinations of individual formations disclosed in known technologies and the above embodiments, or the like. Furthermore, the technical scope of the present technology is not limited to the above-described embodiments, but extends to matters described in the claims and their equivalents.

Moreover, the present technology may also be configured as below.

(1)

An imaging apparatus including:

a solid-state imaging element having a plurality of pixels two-dimensionally arrayed on an imaging surface;

a light shielding unit that shields an invisible light imaging region of the solid-state imaging element in a space above the imaging surface of the solid-state imaging element;

a first optical system that allows light corresponding to visible light contained in external light to be incident on the visible light imaging region of the solid-state imaging element; and a second optical system that allows light corresponding to invisible light contained in external light to be incident on an invisible light imaging region covered by the light shielding unit.

(2)

The imaging apparatus according to (1), in which the second optical system includes an optical fiber that guides the invisible light contained in the external light to the invisible light imaging region.

(3)

The imaging apparatus according to (1), in which the second optical system includes a scintillation fiber that guides scintillation light generated by invisible light contained in the external light to the invisible light imaging region.

(4)

The imaging apparatus according to (3), in which a filter that selectively passes the invisible light is provided in an entrance opening of the scintillation fiber in the second optical system.

(5)

The imaging apparatus according to (1), in which the first optical system includes a cut filter that reflects ultraviolet rays as invisible light contained in the external light, and the second optical system includes a portion that guides the ultraviolet rays reflected by the cut filter to the invisible light imaging region.

(6)

The imaging apparatus according to (1), in which the first optical system includes a cut filter that reflects infrared rays as invisible light contained in the external light, and the second optical system includes a light guide structure that guides the infrared rays reflected by the cut filter to the invisible light imaging region.

(7)

An electronic device including:

a solid-state imaging element having a plurality of pixels two-dimensionally arrayed on an imaging surface;

a light shielding unit that shields an invisible light imaging region of the solid-state imaging element in a space above the imaging surface of the solid-state imaging element;

a first optical system that allows light corresponding to visible light contained in external light to be incident on the visible light imaging region;

a second optical system that allows light corresponding to invisible light contained in external light to be incident on an invisible light imaging region covered by the light shielding unit; and a display apparatus that displays information regarding the invisible light, based on a signal photoelectrically converted on a pixel of the invisible light imaging region.

REFERENCE SIGNS LIST

10 Substrate
20 Solid-state imaging element
20a Imaging surface
21 Imaging region
21a First region
21b Second region
22 Effective pixel region
23 Optical black pixel region
30 Frame body
40 Transparent plate
50 Optical fiber
50a to 50d Optical fiber
51 Entrance opening
52 Exit opening
53 Core portion
54 Clad portion
55 Cover portion
56 Wavelength selection filter
60 Scintillator
70 Light shielding unit
71 Partition wall
72 Partition wall
80 Lens system
100 Imaging apparatus
200 Imaging apparatus
300 Imaging apparatus
310 Substrate
320 Solid-state imaging element
321a First region
321b Second region
330 Frame body
340 Transparent plate
350 Scintillation fiber
351 Entrance opening
352 Exit opening
370 Light shielding unit
380 Lens system
400 Imaging apparatus
410 Substrate
420 Solid-state imaging element
420a Imaging surface
421 Imaging region
421a First region
421b Second region
430 Frame body
440 Transparent plate
460 Scintillator
470 Light shielding unit
471 Partition wall
480 Lens system
500 Imaging apparatus
510 Substrate
520 Solid-state imaging element
521 Imaging region
522 Effective pixel region
523 Optical black pixel region
550, 550a to 550e Scintillation fiber
555, 555a to 555e Optical fiber
570 Light shielding unit
571, 571a to 571e Through hole
572 Concave portion
A First optical system
B Second optical system
3A First optical system
3B Second optical system
4A First optical system
4B Second optical system

The invention claimed is:

1. An imaging apparatus, comprising:
a solid-state imaging element having a plurality of pixels two-dimensionally arrayed on an imaging surface of the solid-state imaging element;
a light shielding unit configured to shield an invisible light imaging region of the solid-state imaging element, wherein the light shielding unit is in a space above the imaging surface of the solid-state imaging element;
a first optical system configured to allow incidence of light corresponding to visible light on a visible light imaging region of the solid-state imaging element, wherein the visible light is a part of external light incident on the first optical system from outside the first optical system; and
a second optical system configured to:
allow incidence of light corresponding to invisible light on the invisible light imaging region shielded by the light shielding unit, wherein
the invisible light is a part of the external light incident on the second optical system from outside the second optical system, and
the second optical system is different from the first optical system; and
restrict incidence of the light corresponding to the visible light on the invisible light imaging region shielded by the light shielding unit.

2. The imaging apparatus according to claim 1, wherein the second optical system includes an optical fiber configured to guide the invisible light to the invisible light imaging region.

3. The imaging apparatus according to claim 1, wherein the second optical system includes a scintillation fiber configured to guide scintillation light to the invisible light imaging region, and
the scintillation light is generated by the invisible light.

4. The imaging apparatus according to claim 3, wherein the second optical system further includes a filter in an entrance opening part of the scintillation fiber, and
the filter is configured to selectively pass the invisible light.

5. The imaging apparatus according to claim 1, wherein the first optical system includes a cut filter configured to reflect ultraviolet rays as the invisible light, and
the second optical system includes a light guide structure configured to guide the ultraviolet rays, reflected by the cut filter, to the invisible light imaging region.

6. The imaging apparatus according to claim 1, wherein the first optical system includes a cut filter configured to reflect infrared rays as the invisible light, and
the second optical system includes a light guide structure configured to guide the infrared rays, reflected by the cut filter, to the invisible light imaging region.

7. An electronic device, comprising:
a solid-state imaging element having a plurality of pixels two-dimensionally arrayed on an imaging surface of the solid-state imaging element;
a light shielding unit configured to shield an invisible light imaging region of the solid-state imaging element, wherein the light shielding unit is in a space above the imaging surface of the solid-state imaging element;
a first optical system configured to allow incidence of light corresponding to visible light on a visible light imaging region of the solid-state imaging element, wherein the visible light is a part of external light incident on the first optical system from outside the first optical system;
a second optical system configured to:
allow incidence of light corresponding to invisible light on the invisible light imaging region shielded by the light shielding unit, wherein
the invisible light is a part of the external light incident on the second optical system from outside the second optical system, and
the second optical system is different from the first optical system; and
restrict incidence of the light corresponding to the visible light on the invisible light imaging region shielded by the light shielding unit; and
a display apparatus configured to display information, regarding the invisible light, based on a signal photoelectrically converted on a pixel of the invisible light imaging region.

8. The imaging apparatus according to claim 1, wherein the light shielding unit is further configured to shield the invisible light imaging region from the light corresponding to the visible light incident on the visible light imaging region.

9. The imaging apparatus according to claim 1, wherein the invisible light imaging region is different from the visible light imaging region.

10. The imaging apparatus according to claim 1, wherein the light shielding unit is further configured to shield the entire invisible light imaging region,
the light shielding unit includes a partition wall that extends upward from the imaging surface of the solid-state imaging element, and
the partition wall partitions the invisible light imaging region from the visible light imaging region.

* * * * *